United States Patent [19]

Fukuta et al.

[11] Patent Number: 5,470,412
[45] Date of Patent: Nov. 28, 1995

[54] PROCESS FOR PRODUCING A CIRCUIT SUBSTRATE

[75] Inventors: Junzo Fukuta; Masashi Fukaya; Hideaki Araki, all of Yamaguchi, Japan

[73] Assignee: Sumitomo Metal Ceramics Inc., Yamaguchi, Japan

[21] Appl. No.: 97,120

[22] Filed: Jul. 27, 1993

[30] Foreign Application Priority Data

Jul. 30, 1992 [JP] Japan ................... 4-223190
Sep. 11, 1992 [JP] Japan ................... 4-269577

[51] Int. Cl.$^6$ .................. B32B 31/04; B32B 31/20; B32B 31/26; C04B 33/32
[52] U.S. Cl. ................ 156/89; 156/230; 156/233; 264/58; 264/61
[58] Field of Search ............. 156/89, 230, 233; 264/58, 61

[56] References Cited

U.S. PATENT DOCUMENTS

| | | | |
|---|---|---|---|
| 3,655,496 | 4/1972 | Ettre et al. | 156/89 X |
| 3,785,895 | 1/1974 | Ettre et al. | |
| 3,899,554 | 8/1975 | Kaiser et al. | 264/61 X |
| 4,749,421 | 6/1988 | Matsui et al. | 156/89 |
| 4,753,694 | 6/1988 | Herron et al. | |
| 4,756,959 | 7/1988 | Ito et al. | 264/58 X |
| 4,799,984 | 1/1989 | Rellick | |
| 4,994,302 | 2/1991 | Kellerman | 264/61 X |
| 5,085,720 | 2/1992 | Mikeska et al. | 156/89 |
| 5,130,067 | 7/1992 | Flaitz et al. | |
| 5,176,772 | 1/1993 | Ohtaki | 156/89 |
| 5,211,786 | 5/1993 | Enloe et al. | 156/89 |
| 5,271,150 | 12/1993 | Inasaka | 156/89 X |
| 5,277,724 | 1/1994 | Prabhu | 156/89 |

FOREIGN PATENT DOCUMENTS

| | | |
|---|---|---|
| 0479219A1 | 4/1992 | European Pat. Off. . |
| 0246269 | 12/1985 | Japan ................. 156/89 |
| WO91/10630 | 7/1991 | WIPO . |

OTHER PUBLICATIONS

Patent Abstracts of Japan, vol. 13, No. 251 E–771, Dec. 6, 1989, JP-A-1051610, Feb. 27, 1989.

*Primary Examiner*—James Engel
*Assistant Examiner*—M. Curtis Mayes
*Attorney, Agent, or Firm*—Oblon, Spivak, McClelland, Maier & Neustadt

[57] ABSTRACT

A process for producing circuit substrate is prepared by preparing at least one ceramic greensheet containing glass and sinterable at a low temperature for forming the circuit substrate, and at least one unsintered transfer sheet unsinterable at a sintering temperature of the ceramic greensheet, printing a wiring pattern on the unsintered transfer sheet, stacking the unsintered transfer sheet on the ceramic greensheet to form a laminated body and thermocompressing the laminated body to form a compressed body, firing the compressed body at a sintering temperature of the ceramic greensheet to form a ceramic substrate, thereby preparing a fired body by transferring the wiring pattern on the unsintered transfer sheet to the ceramic substrate, and removing the unsintered transfer sheet from the fired body to prepare a circuit substrate.

24 Claims, 15 Drawing Sheets

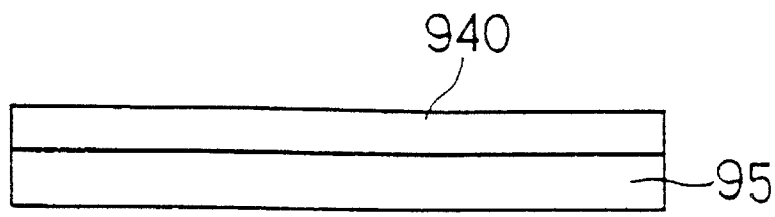
FIG. 6A
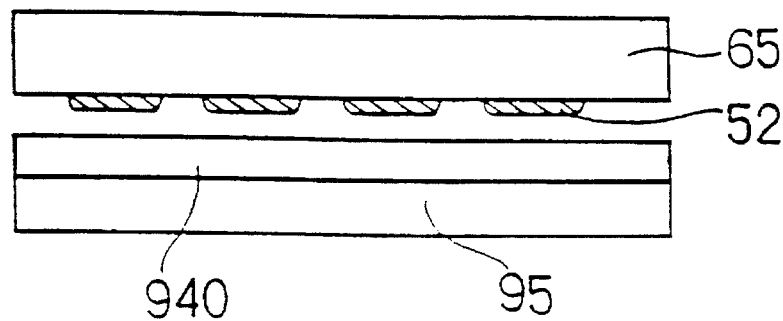
FIG. 6B
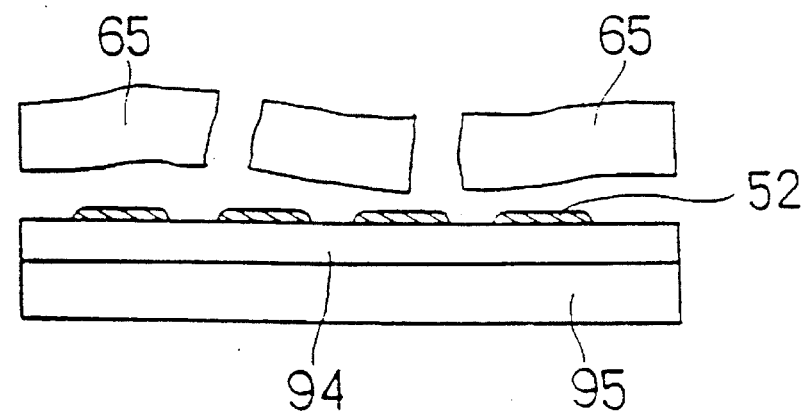
FIG. 6C
FIG. 7
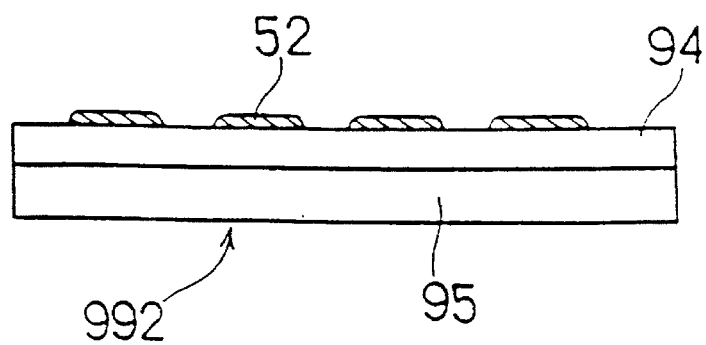

PROCESS FOR PRODUCING A CIRCUIT SUBSTRATE

BACKGROUND OF THE INVENTION

1. Field of the Invention

The present invention relates to a process for producing a circuit substrate which is useful for forming a precise wiring pattern on a ceramic substrate.

2. Description of the Related Art

Conventionally electronic equipment has been provided with built-in electronic components. The electronic components are formed of ceramic substrates which can be fired at relatively low temperatures ranging from 800° C. to 1000° C. (Japanese Publication No: 53269/1991, U.S. Pat. No. 4,621,066.

A conventional ceramic circuit substrate is produced by a process in which as a first step via holes and wiring patterns are formed in a plurality of ceramic greensheets. Thereafter, as FIG. 18 shows, ceramic greensheets 71–74 are stacked and sandwiched between plates 11 and 19 which are positioned parallel to each other. The ceramic greensheets are compressed by applying downward pressure from upper plate 11, and are affixed together into a ceramic compressed body. The ceramic compressed body is fired in order to prepare a ceramic circuit substrate.

The ceramic circuit substrate which is prepared, however, has a substantially large planar dimensional tolerance exceeding ±0.3% at compressing and firing, because of spread both in the planar elongation rate and in the dimension of the greensheets at compressing, and differences in shrinkage of the individual greensheets at firing. These factors significantly complicate the precision of positioning the surface wiring pattern on the greensheets.

Recently improvements in the planar dimensional precision of ceramic circuit substrates have been required by tightening the tolerance to ±0.05% or less because of the necessity of current technological tendencies such as downsizing and high densification.

Conventional circuit substrates of other types are produced by preparing greensheets in a first step which are used for forming ceramic bodies containing glass. They are provided with holes which are filled with conductors. Wiring patterns are printed on the greensheets. A plurality of greensheets having the wiring patterns formed thereon are prepared. Those greensheets are stacked, compressed, and fired at a temperature ranging from 800° C. to 1000° C. thus providing circuit substrates. However, in this process for producing the conventional circuit substrate, as FIG. 19 shows, when stacking, compressing, and firing to obtain a plurality of ceramic substrates 99 and 98, the irregularity of the wiring patterns 59 may cause unevenness of the ceramic substrate 98. In this case, as FIG. 20 shows, when forming a wiring pattern 58 on uneven ceramic substrate 98, the width of the wiring pattern 58 may deviate from that of the designed pattern 580 thereby causing the tolerance to exceed ±10 μm because of the unevenness of the wiring pattern 59. The large dimensional tolerance may cause a blur 581, deficiency 582, or the like in the resultant pattern.

In the event the wiring pattern is printed on the ceramic greensheet of a top, as shown in FIGS. 21 and 22, protuberances 571 of conductors formed by filling holes 90 with conductive material may cause blurs 581 and deficiencies 182 in the wiring pattern 58. In the event the wiring pattern is provided with a resistor, the tolerance of the resistance value may exceed ±25%, resulting in a decrease in the yield of resistance trimming.

Alternatively the circuit substrate may be produced by using a pre-fired ceramic body obtained by the preliminary firing of the ceramic greensheets. In this case, the solvent present in the paste which forms the wiring pattern on the surface of the pre-fired ceramic body is not absorbed, which means that the wiring pattern is not formed precisely.

SUMMARY OF THE INVENTION

Accordingly one object of the present invention to provide a process for producing a circuit substrate which reduces planar dimensional variations during thermoimpression, and planar shrinkage during firing of ceramic greensheets, as well as allowing the wiring pattern to be precisely formed thereon.

Briefly, this object and other objects of the present invention as hereinafter will become more readily apparent can be attained in a process for producing a circuit substrate comprising the steps of:

preparing at least one ceramic greensheet containing glass which is sinterable at a low temperature for forming said circuit substrate, and at least one unsintered transfer sheet which is unsinterable at a sintering temperature of said ceramic greensheet;

printing a wiring pattern on said unsintered transfer sheet;

stacking said unsintered transfer sheet on said ceramic greensheet to form a laminated body and thermocompressing said laminated body to form a compressed body;

firing said compressed body at a sintering temperature of said ceramic greensheet to form a ceramic substrate and to prepare a fired body by transferring said wiring pattern on said unsintered transfer sheet to said ceramic substrate; and removing said unsintered transfer sheet from said fired body, thereby preparing a circuit substrate.

BRIEF DESCRIPTION OF THE DRAWINGS

A more complete understanding of the invention and many of the attendant advantages thereof will be readily obtained as the same becomes better understood by reference to the following detailed description when considered in connection with the accompanying drawings, wherein:

FIGS. 6(a)–6(c) represent the individual step for producing the circuit substrate of Example 2.

FIG. 7 is a sectional view showing a circuit substrate produced by the process steps of Example 2.

DETAILED DESCRIPTION OF THE PREFERRED EMBODIMENTS

Figure 1A:
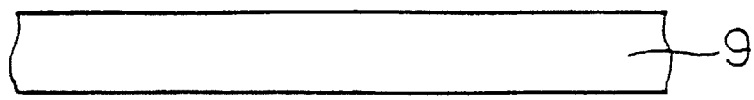
FIGS. 1(a)–1(d) represent an individual step in the production of a ceramic greensheet of Example 1.
Figure 1B:
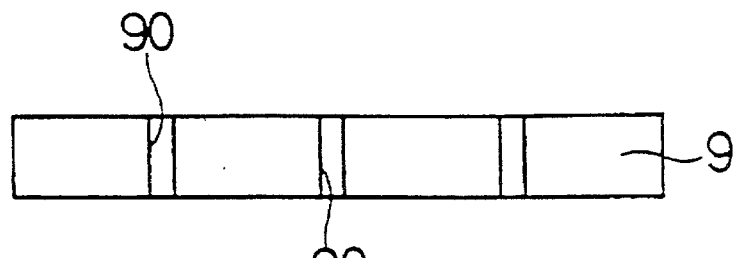

The most salient feature of the present invention as described above is a series of process steps in which a unsintered transfer sheet is affixed onto ceramic greensheets, a wiring pattern on the unsintered transfer sheet is transferred to the ceramic body by firing, and the unsintered transfer sheet is removed. The sintering temperature of the compressed body is preferably under 1000° C. If the temperature exceeds 1000° C., the wiring pattern cannot be formed of metals selected from the group consisting of Au, Ag, Pd—Ag, Pt—Ag, and Cu. One or more ceramic greensheets are used for forming the ceramic body containing glass which are sinterable at a relatively low temperature ranging from 800° C. to 1000° C. The ceramic greensheet can be obtained by using doctor blade casting.

The ceramic greensheets may be provided with a plurality of holes filled with a conductor prior to the process for stacking those sheets. They may also have the wiring pattern formed on either one or both surfaces thereof prior to the stacking process. The material of the conductor and the wiring pattern is Au, Ag, Pd—Ag, Pt—Ag, and Cu.

The unsintered transfer sheet having excellent printing properties which is unsinterable at a sintering temperature of the ceramic greensheets. The unsintered transfer sheet is formed by mixing a binder and a powdered material such as alumina, zirconia, mullite, or the like. Preferably the sheet ranges in thickness from 100 μm to 1000 μm. In case it is under 100 μm, great care is required in handling. Otherwise it may be deformed. If the sheet exceeds 1000 μm in thickness, the binder present in the sheet may not be sufficiently removed.

The laminated body may be formed by disposing the unsintered transfer sheets on both surfaces of the ceramic green body composed of the ceramic greensheets. The laminated body may be formed by disposing the unsintered transfer sheet on the upper surface of the ceramic green body. Preferably, the unsintered transfer sheet may be interposed between the ceramic greensheets in order to improve the processing efficiency. That is a plural layer formed by stacking a plurality of the laminated body which is thermo-compressed.

In the step of compressing the ceramic greensheets, the laminated body may be compressed by applying upward and downward pressures from the plates sandwiching them, while maintaining the laminated body placed in a rigid frame having the shape of the laminated body, to form the compressed body. The compressed body is removed from the frame for firing. This may result in the circuit substrate restraining planar shrinkage during firing and a planar dimensional dispersion kept as minimum as possible.

The process according to the present invention allows the ceramic greensheet to be affixed to the pre-fired substrate in order to form the wiring pattern thereon by means of the transfer sheet. The pre-fired substrate is formed of alumina, zirconia, aluminum nitride or the like, and is then fired at a temperature higher than the sintering temperature of the ceramic greensheet.

The ceramic greensheets are subjected to preliminary sintering in order to affix the transfer sheet thereon. The transfer sheet may be affixed to the ceramic circuit substrate which is preliminarily sintered and provided with an intermediate layer on its surface.

The intermediate layer containing glass and/or ceramic glass and binder is in the form of paste, and applied through screen printing. It is preferable to use an intermediate layer which can be fired at a low temperature of under 1000° C. In the event the firing temperature exceeds 1000° C., it is difficult to use metal selected from the group consisting of Au, Ag, Pd—Ag, Pt—Ag, and Cu, as the material for forming wiring patterns. Other features are the same as those of the first aspect of the invention.

In the present invention, the unsintered transfer sheet serves to absorb the solvent present in the conductor paste used for the wiring pattern in order to prevent the conductor from blurring. The wiring pattern, thus, can be printed on the unsintered transfer sheet precisely, which allows the wiring pattern to be formed on the surface of the circuit substrate containing glass precisely.

At the step for sintering and transferring, the compressed body is fired at a sintering temperature of the ceramic greensheet to prepare the fired body. At this stage, the glass present in the ceramic greensheet are softened during firing and is fused with the wiring pattern on the unsintered transfer sheet. The unsintered transfer sheet at the same step, however, is not sintered but the organic binder present therein decomposes. As a result, the unsintered transfer sheet becomes breakable and is likely to come off.

After the above step, the unsintered transfer sheet can be easily removed by lightly tapping the fired body.

In the present invention, the unsintered transfer sheet is preferable in the form of flexible. In this case, the wiring pattern can be precisely formed on the circuit substrate. The unsintered transfer sheet is affixed to the intermediate layer which is formed on the ceramic body. The resultant compressed body is then fired at a sintering temperature of the intermediate layer. The softened intermediate layer is fused with the wiring pattern which is then formed onto the surface of the ceramic body.

The present invention provides a process for producing a circuit substrate comprising the steps of:

preparing at least one ceramic greensheet and an unsinterable greensheet which is not sintered at a sintering temperature of the ceramic greensheet;

stacking unsinterable greensheets on both surfaces of said ceramic greensheet to form a laminated body;

compressing said laminated body thereby preparing a compressed body while maintaining its planar elongation rate under 0.05%;

firing said compressed body at a sintering temperature of said ceramic greensheet; and removing said unsinterable greensheet from said compressed body thereby obtaining a sintered ceramic substrate.

The most salient feature of the above process is the series of steps in which a compressed body is produced by compressing the laminated body, firing the body and then removing the unsintered greensheets. In order to compress the laminated body while maintaining the planar elongation rate 0.05% or less, it is placed within a rigid frame having the shape of the laminated body. The body is compressed by applied upward and downward pressures, by means of the plates sandwiching it. The inner planar shape of the rigid frame is the same as that of the laminated body. When the laminated body is compressed, the laminated body is compressed with the applied downward and upward pressures exerted from upper and lower parallel plates in the rigid frame. It also serves to prevent the ceramic greensheets from planar elongating, thus providing a circuit substrate which has excellent planar dimensional precision.

Alternatively the laminated body may be compressed by means of upper and lower parallel plates in the presence of films (surface roughness: 0.4–0.75 μm Ra) between the laminated body and the plates. The films serve to restrain the planar elongation rate of the ceramic greensheet as much as possible, thus, providing a compressed body having excellent planar dimensional precision. However, in the event the surface roughness of the film becomes less than 0.4 μm Ra, the planar elongation rate will increase. In the event it exceeds 0.75 μm Ra, the obtained compressed body will have a rough surface. Accordingly, it becomes difficult to exfoliate the film from the unsintered transfer sheet.

Suitable films may be formed of polyester, polyphenylene sulfide polyether imide, polyether sulfone, polyether ketone, polyimide, methylpentene copolymer, paper, or the like.

The laminated body may be compressed by means of another method used with liquids which is the so called iso-directional pressurization. In this method, the laminated body is placed in a water-proof bag, and the bag is sealed. The sealed bag is submerged in the liquid to be compressed. The laminated body in the bag is subjected to pressure uniformly in all directions. The resultant compressed body has the least planar elongation rate and planar dimensional variation.

The inside of the sealed bag is preferably in a vacuum state in order to allow the liquid to compress the laminated body directly. The ceramic greensheet is preferably formed of a material sinterable at 1000° C. or less. The unsinterable greensheet is unsinterable at the sintering temperature of the ceramic greensheet. The unsinterable greensheet may be formed of, for example, alumina. The ceramic body may be initially provided with a plurality of holes filled with conductor and wiring pattern. At least one or more ceramic greensheets and ceramic substrates may be used in order to prepare a circuit substrate of the present invention.

According to the above producing process, the laminated body is pressurized to prepare a compressed body while restraining the planar elongation rate to 0.05% or less. The compressed body before firing has a small planar elongation rate and planar dimensional variation. Therefore, the planar shrinkage rate and planar dimensional variation are minimized even after firing.

Upon being compressed into a compressed body, the laminated body is interposed between unsinterable greensheets, both of which are heated for firing. The planar dimensional tolerance of the thus fired circuit substrate is ±0.05% or less (see Table 3), thereby improving the printing precision of the wiring pattern.

Having now generally described this invention, a further understanding can be obtained by reference to certain specific examples which are provided herein for purposes of illustration only and are not intended to be limiting unless otherwise specified.

EXAMPLES

Example 1

Figure 5:
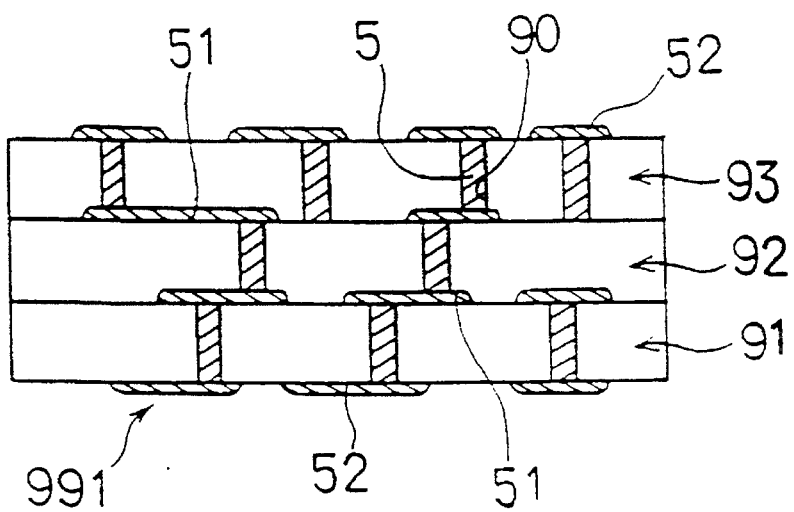
FIG. 5 is a sectional view showing a circuit substrate produced by the process steps of Example 1.

Reference is here made to FIGS. 1 to 5. The circuit substrate produced by the process according to Example 1 is obtained by firing the ceramic green body formed of the ceramic greensheets. As FIG. 5 shows, a circuit substrate 991 is composed of ceramic substrates 91, 92, and 93, wiring patterns 51 and 52, and holes 90 filled with a conductor. The ceramic substrates 91 and 92 have wiring patterns 51 formed on their surfaces. The circuit substrate 91 has the wiring patterns 52 formed on both surfaces.

In the process for producing the circuit substrate of Example 1, ceramic greensheets 910, 920 and 930 are prepared in a first step for forming the ceramic substrates 91, 92 and 93, respectively.

In order to form the ceramic greensheet 910, glass ($CaO-Al_2O_3-SiO_2-B_2O_3$:60 wt. %) and alumina (40 wt. %) are mixed. The mixed powder, as a material for forming the ceramic substrate, is further mixed with solvent, binder and plasticizer, and is subjected to kneading to form a slurry.

The slurry is then subjected to doctor blade casting by a known technique to form a ceramic greensheet 9 with its thickness of 0.25 mm as shown in FIG. 1(a).

The ceramic greensheet 9 is cut into square pieces (150 mm×150 mm) in which holes 90 (diameter: 0.2 mm) are punched in preparation for forming the wiring pattern as shown in FIG. 1 (b).

Figure 1C:
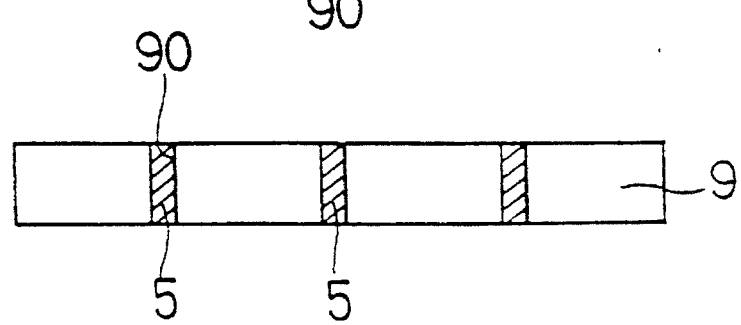
Figure 1D:
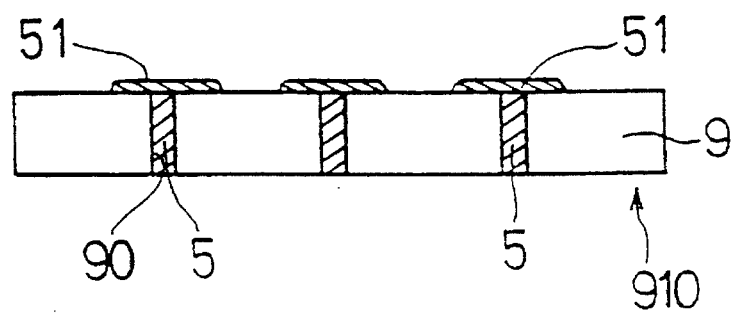

The holes 90 are filled with metallic conductor 5 as shown in FIG. 1(c).

The wiring patterns 51 of metallic conductor are formed on the surface of the ceramic greensheet 9 by means of screen printing, resulting in the ceramic greensheet 910 used for forming the ceramic substrate 91. The metallic conductor is selected from the group of Ag, Pd—Ag, Pt—Ag, Au, and Cu. The ceramic greensheets 920 and 930 are also formed in the same way as above. However, the wiring pattern 51 is not formed on the surface of the ceramic greensheet 930.

Figure 2:
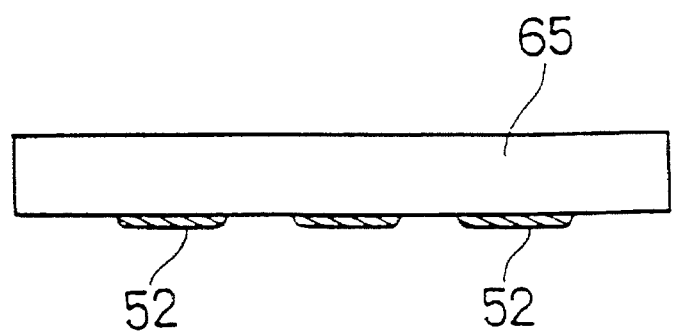
FIG. 2 represents the step for producing a transfer sheet of Embodiment 1.

Next in the second step printing process, a transfer sheet is prepared. A solvent, a binder and a plasticizer are added to aluminum powder (average particle size: 0.5 μm), which is subjected to kneading to form slurry. The slurry is subjected to the doctor blade casting to form the transfer sheet with its thickness of 0.4 mm. The transfer sheet is unsinterable at a sintering temperature of the ceramic greensheet. It is cut into square pieces (150 mm×150 mm). As FIG. 2 shows, the wiring patterns 52, which are to be formed on the surface of the circuit substrate, are printed on the transfer sheet 65.

Figure 3A:
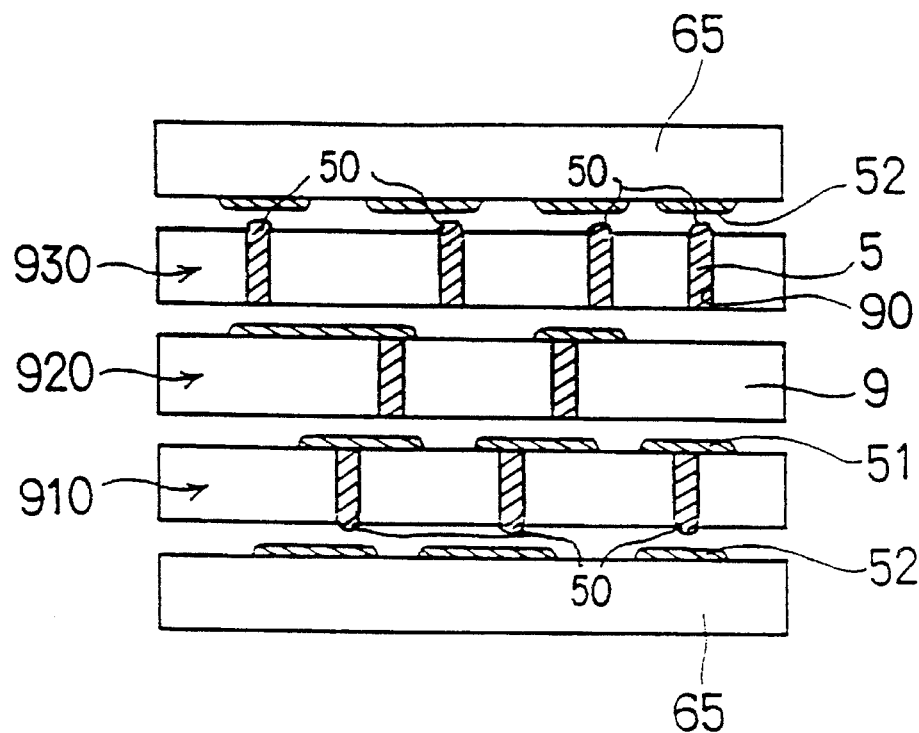
FIGS. 3(a)–3(b) represent the step of stacking the ceramic greensheets followed by the steps shown in FIGS. 1 and 2.

In the third step compressing process, the ceramic greensheets 910, 920, and 930 are stacked. As FIG. 3(a) shows, the transfer sheets 65 are placed on both surfaces of the green body of the ceramic greensheets to prepare a laminated body. The laminated body is well-aligned in preparation for hot fusing at 50 kg/cm² and 100° C. for 20 seconds by means of a metal mold to obtain a compressed body.

Figure 3B:
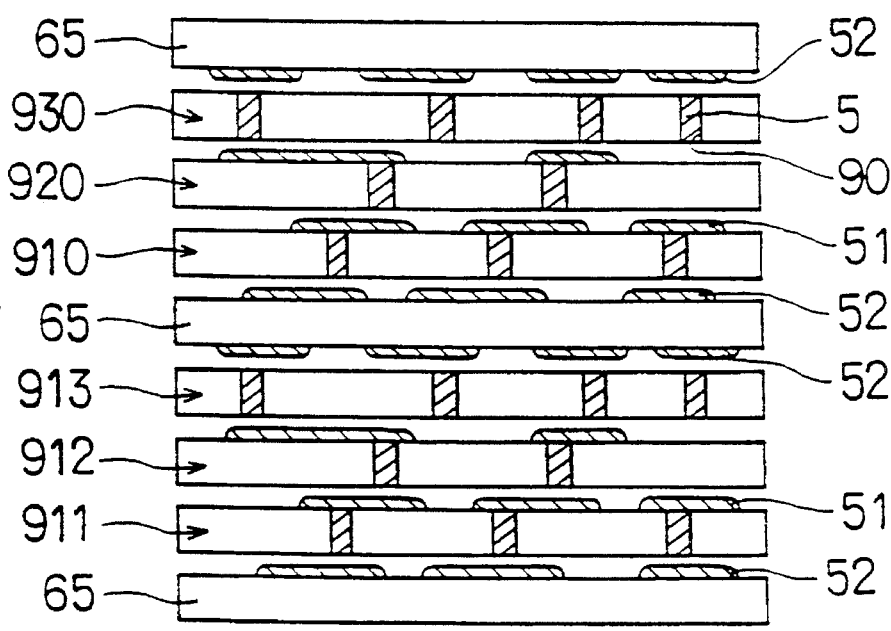
Figure 4:
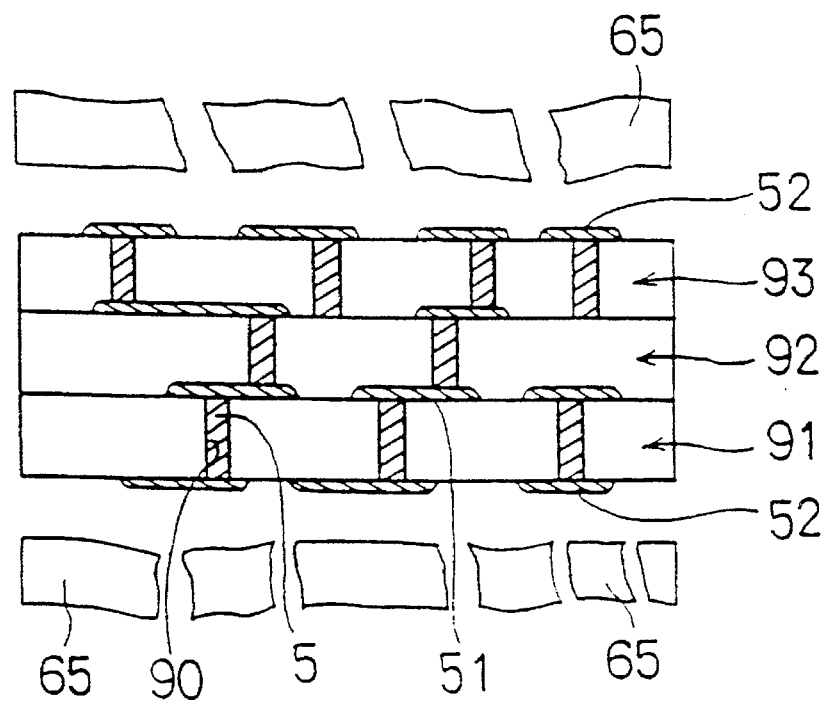
FIG. 4 represents the step for of removal of the unsintered transfer sheets followed by the step shown in FIG. 3.

Furthermore, as shown in FIG. 3(b), a plural layer, which is fabricated by stacking a plurality of the laminated body is preferably thermocompressed. That is, the transfer sheet 65 may be sandwiched between the green bodies of the ceramic greensheets 910, 920, 930, and 911, 912, 913. The transfer sheets 65 may be further placed on both surfaces of the assemblage of those green bodies as FIG. 3(b) shows, thus improving the process efficiency.

In the fourth step sintering and transferring process, the prepared compressed body is fired in the air at 900° C. for 20 minutes. The ceramic greensheets 910, 920 and 930 are sintered to a ceramic body of integrated ceramic substrates 91, 92, and 93. The ceramic greensheets 11, 12, and 13 are sintered to a ceramic body of integrated ceramic substrates 91, 92, and 93. Concurrently the wiring patterns 52 on the transfer sheets 65 are transferred onto both surfaces of the ceramic body. At this stage, the transfer sheets 65 are kept unsintered. In a process as the last step, the unsintered transfer sheets 65 are removed by being lightly tapped and the circuit substrate 991, as FIG. 5 shows, is obtained.

Also, as shown in FIG. 3(a), wiring pattern 52 is printed on the transfer sheet 65 which has flat surface.

Therefore, as shown in FIG. 5, the aforementioned wiring patterns 52 can be precisely formed on both the front surface and the reverse surface without being hampered by protuberances 50 of conductors formed by filling holes 90 with conductive material.

In the sintering and transferring step, the compressed body is fired at a sintering temperature of the ceramic greensheets 910, 920, and 930, to prepare a fired ceramic body. The glass contained in the ceramic greensheets is softened and fuses with the wiring patterns on the transfer sheet 65. While in the same step, the transfer sheets 65 are kept unsintered, but the binder contained therein has decomposed. The unsintered transfer sheets 65, thus, become breakable and are likely to come off. In the following removing step, the unsintered transfer sheets 65 can be easily removed by lightly tapping the fired body.

And it is also possible to follow the following steps:

In the compressing step, a laminated body comprising said ceramic greensheets 910, 920, 930, which is sandwiched by unsintered transfer sheets 65, is surrounded tightly by the rigid frame. Plates are placed on top of and at the bottom of the laminated body and upward and downward pressure is applied. After the compression, a compressed body is removed from the rigid frame and is sintered. (Refer to FIG. 10.)

Example 2

In this example, the ceramic greensheets are formed on a pre-fired substrate. As FIG. 6 and 7 shows, a circuit substrate 992 produced according to this embodiment is formed by stacking and thermocompressing a ceramic greensheet 940 to the surface of a pre-fired substrate 95. The transfer sheet 65 has wiring patterns 52.

In the first step of the process, a ceramic greensheet 940 for forming the ceramic substrate 94 is placed on a pre-fired substrate 95, alumina, as FIG. 6(a) shows.

In order to form the ceramic greensheet 940, glass ($CaO\text{---}Al_2O_3\text{---}SiO_2\text{---}B_2O_3$: 75 wt. %) and alumina (25 wt. %) are mixed. Then the mixed powder, as a material for forming the ceramic substrate 94, is further mixed with solvent, binder, and plasticizer. This mixture is kneaded to form a slurry. The slurry is cast by a doctor blade to form the ceramic greensheet 940 (thickness: 0.25 mm) which is placed on a surface of the pre-fired substrate 95. The ceramic greensheet 940 and the pre-fired substrate 95 are thermocompressed.

In the second step sheet compressing process, as FIG. 6(b) shows, the transfer sheet 65, which is the same as that in Example 1, is stacked on upper surface of the ceramic greensheet 940. The combination is subjected to thermocompression at 50 kg/cm² and 100° C. for 20 seconds to prepare a compressed body.

Then in the third step transferring process, step, as FIG. 6(c) shows, the compressed body is fired in the air at 900° C. for 20 minutes.

The ceramic greensheet 940 is sintered to be a ceramic substrate 94 which is integrated with the pre-fired substrate 95. At the same time, the wiring patterns 52 on the transfer sheet 65 are transferred to the upper surface of the ceramic substrate 94. At this stage, the transfer sheet 65 is kept unsintered.

In a final step as FIG. 7 shows, the unsintered transfer sheet 65 is removed and the circuit substrate 992 is obtained.

In Example 1, the transfer sheets 65 serve to absorb the solvent contained in the wiring patterns 52 so as to prevent the conductor paste thereof from blurring. Thus, the wiring patterns 52 can be printed on the transfer sheet 65 precisely. Accordingly the wiring patterns 52 printed on the transfer sheet 65 can be transferred on both surfaces of the circuit substrate 991 precisely.

Other features and resultant effects are the same as those of Example 1.

Example 3

Figure 8A:
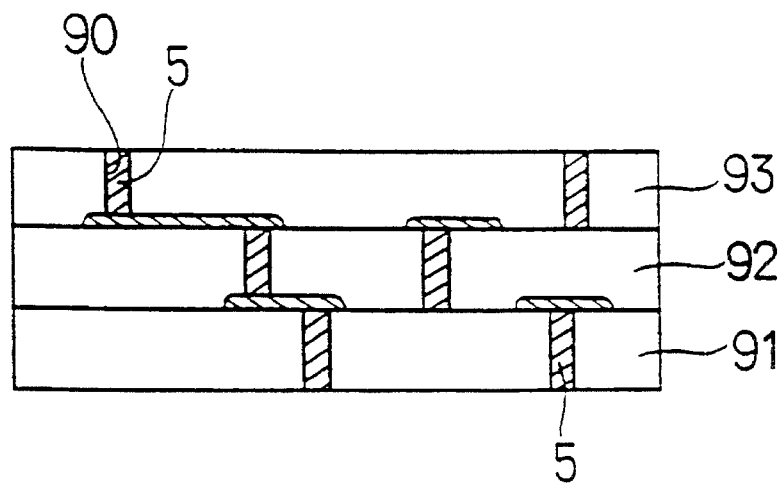
FIGS. 8(a)–8(b) represent the individual step for producing the circuit substrate of Example 3.

This example is characterized by a sintering step, as FIG. 8(a) shows, which is carried out prior to the compressing step in Example 1. In the sintering step, the ceramic greensheets 910, 920 and 930 (see FIG. 3) are pre-fired to prepare a ceramic body of the ceramic substrates 91, 92, and 93, respectively.

These ceramic greensheets have holes 90 filled with metallic conductors 5, and the wiring patterns 51 (see FIG. 1) are the same as in Example 1. The ceramic greensheets are subjected to firing in the air at 870° C. for 20 minutes.

Figure 8B:
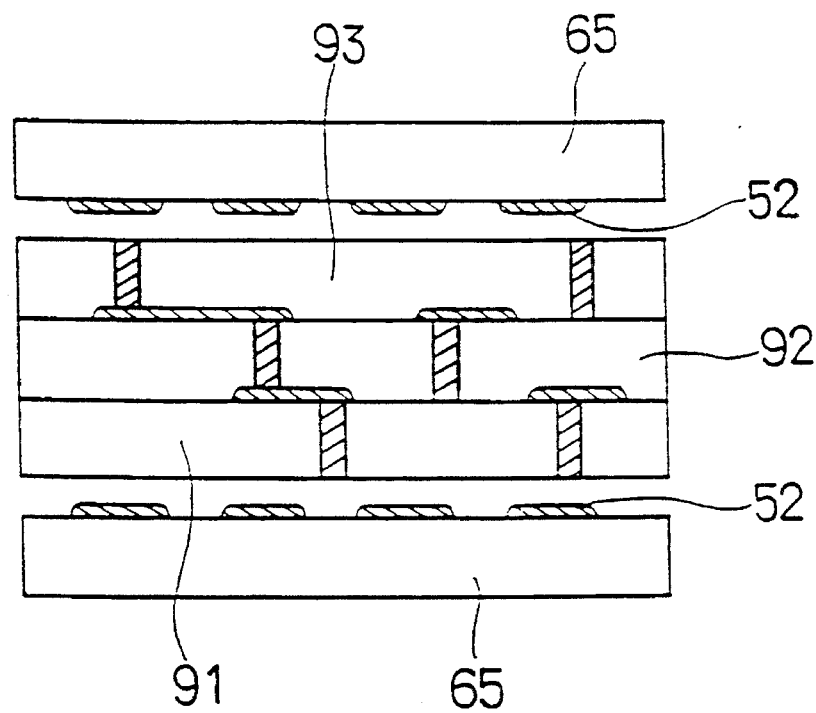

In the compressing step, as FIG. 8(b) shows, the transfer sheets 65 are placed on both surfaces of a ceramic body integrated with the ceramic substrates 91–93, and are aligned to prepare a laminated body. They are likewise subjected to thermocompression at 50 kg/cm² and 100° C. for 20 seconds to prepare a compressed body composed of the ceramic body, and transfer sheets 65.

In the transferring process, the compressed body is fired in the air at 900° C. for 20 minutes. The wiring patterns 52 on the transfer sheets 65 are transferred onto both surfaces of the ceramic body. At this stage, the transfer sheets 65 are kept unsintered.

In the removal step, the unsintered transfer sheets 65 are removed from the fired ceramic body and the circuit substrate which is the same as that obtained in Example 1 (see FIG. 5) is obtained. In this example, transfer sheets 65 are preferably flexible. In this case, wiring patterns 52 which are to be formed on the surface of the ceramic body precisely. Other effects are the same as those of Example 1.

Example 4

In Example 4, as shown in FIG. 9, the circuit substrate has an intermediate layer 96 on a pre-fired ceramic substrate 97; a transfer sheet 65 having wiring patterns 52 on the intermediate layer 96 are placed thereon; and the combination is fired at a softening point of the intermediate layer 96. The intermediate layer 96 containing glass and/or glass ceramic and organic binder is applied on the pre-fired ceramic substrate 97 by screen printing. The structure is fired at a sintering temperature, i.e., 1000° C. or lower.

Figure 9A:
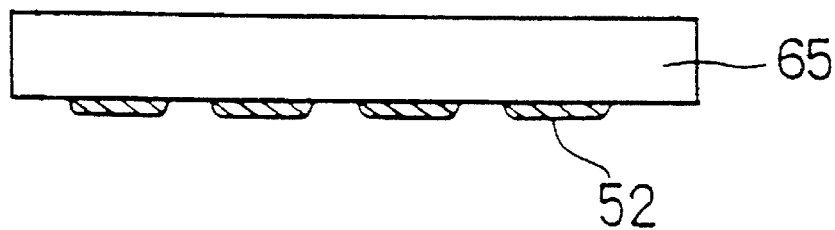
FIGS. 9(a)–9(c) represent the individual step for producing the circuit substrate of Example 4.
Figure 9B:
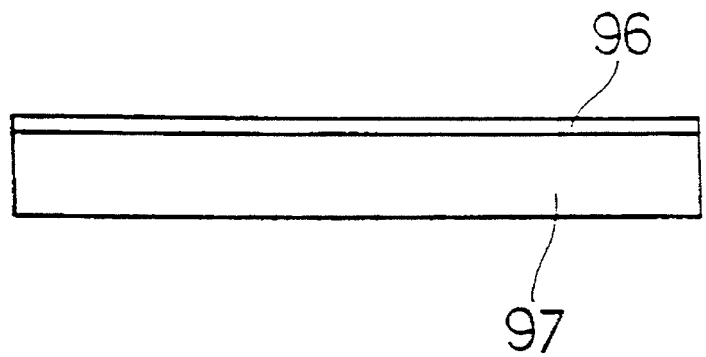

In a first printing step for producing the circuit substrate of this example, as FIG. 9(a) shows, wiring patterns 52 such as a conductor or a resistor are printed on the surface of the transfer sheet 65. In a second step for printing the intermediate layer, as FIG. 9(b) shows, the intermediate layer 96 containing glass and/or glass ceramic is applied on the pre-fired ceramic substrate 97 by means of the screen printing, and dried.

Figure 9C:
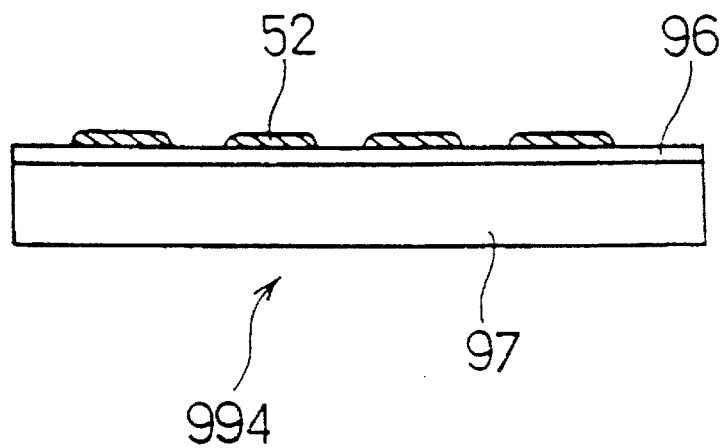

The ceramic substrate 97 is formed of alumina ($Al_2O_3$). The intermediate layer 96 is obtained by adding the solvent and binder to a mixed powder of glass ($CaO$—$Al_2O_3$—$SiO_2$—$B_2O_3$: 75 wt. %) and alumina (25 wt. %) for forming the ceramic substrate, which is then kneaded. Then stacking, firing, transferring, and removing process steps are sequentially carried out in the same way as Embodiment 3 to prepare the circuit substrate 994 as FIG. 9(c) shows.

Other effects are the same as those of Example 2.

Example 5

In this example, each width and irregularity of the wiring pattern of the circuit substrates produced in Examples 1–4 is measured and compared with the designed pattern. As Comparative Examples C1–C4, four types of circuit substrates are produced without using the transfer sheets 65, and subjected to the same measurements as above.

The Comparative Example C1 is the same as Example 1 except that wiring patterns 51 and 52 for the inner and outer layers are pre-printed on the ceramic greensheets 910, 920 and 930, which are fired at a temperature of 900° C. to prepare the ceramic substrates 91, 92 and 93, respectively (see FIG. 5).

The Comparative Example C2 is the same as Example 2 except that the wiring patterns for the outer layer are pre-printed on pre-sintered ceramic substrates 94 and 95 (see FIG. 7).

The Comparative Example C3 is the same as Example 3 except that the wiring patterns 52 are printed on pre-sintered ceramic substrates 91, 92, and 93 (see FIG. 8).

The Comparative Example C4 is the same as Example 4 except that the wiring patterns 52 are directly printed on the surface of the ceramic substrate 97 (see FIG. 9).

Table 1 shows the measured results from each of Examples 1 to 4 and from each of Comparative Examples 1 to 4.

Figure 20:
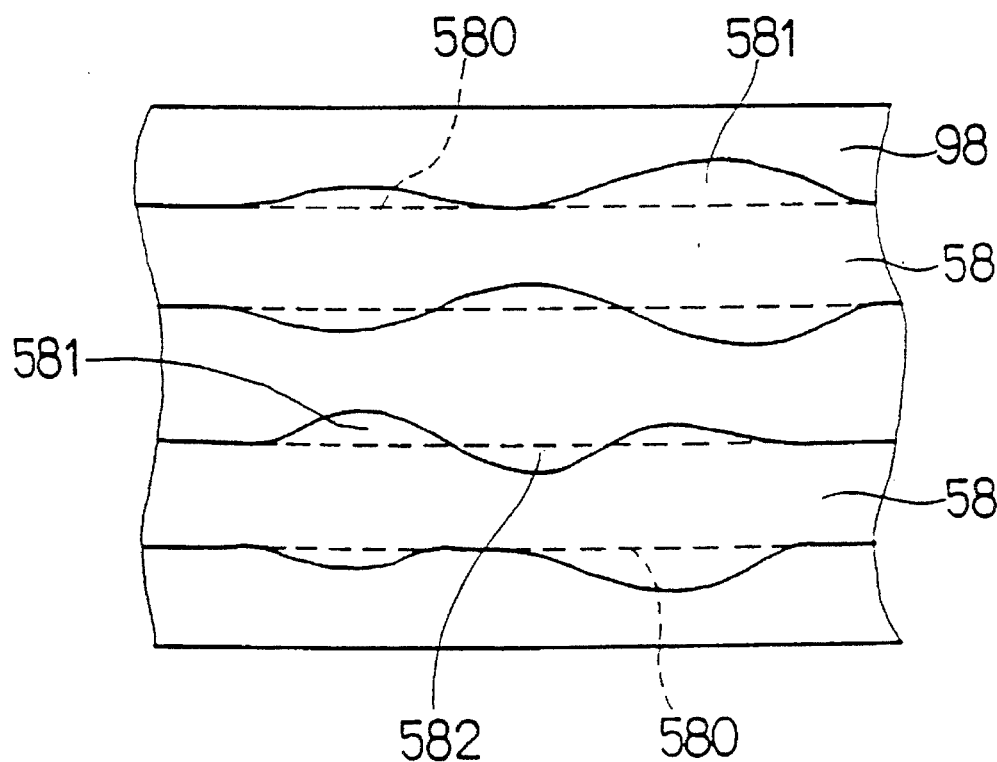
FIG. 20 represents the step of producing the circuit substrate of a further conventional process.
Figure 21:
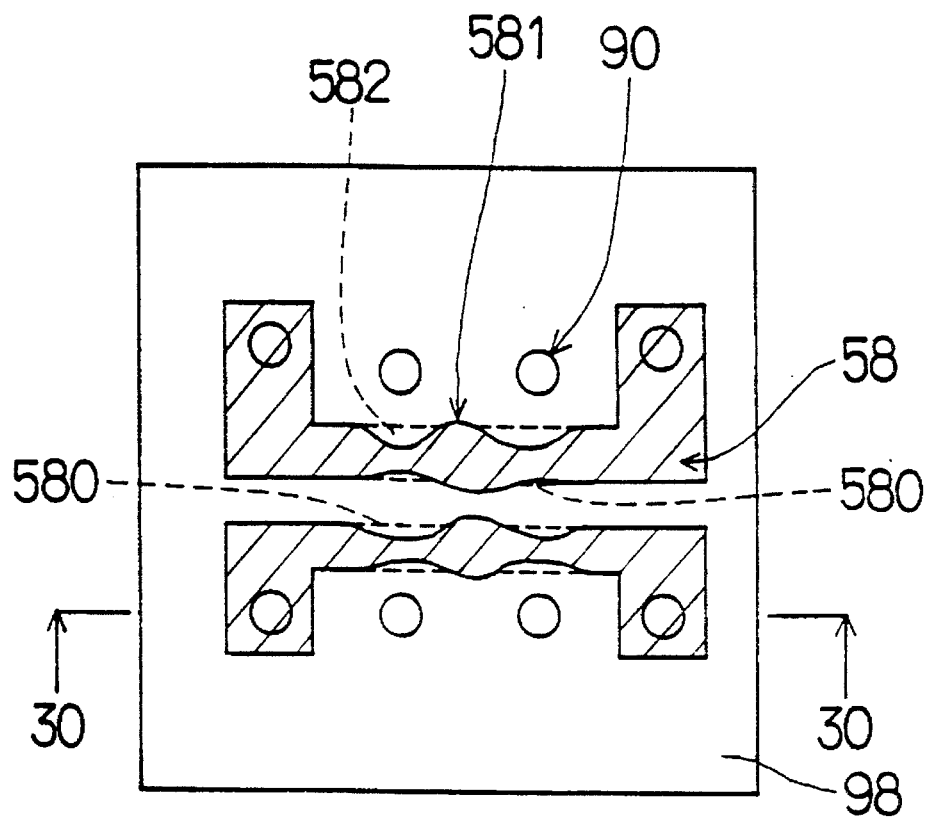
FIG. 21 is a sectional view showing a conventional circuit substrate.
Figure 22:
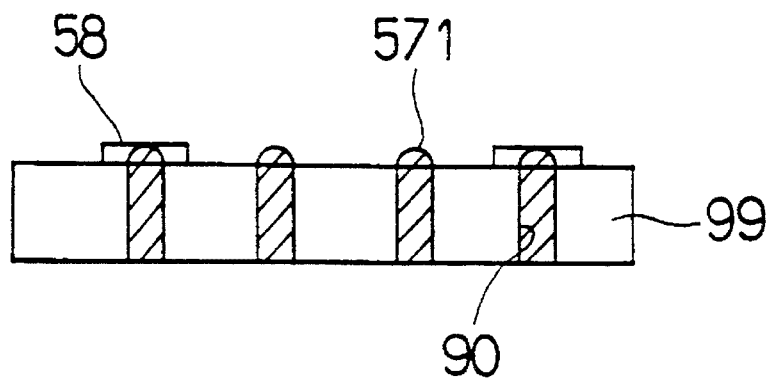
FIG. 22 is a sectional view taken on line 30—30 of FIG. 21.

The "maximum blur" refers to the measured value of the largest blur 581. The "maximum deficiency" refers to the measured value of the largest deficiency 582 as FIG. 20 shows.

Examples 1–4 show measured small values of maximum blur ranging from 5 to 7 μm. While Comparative Examples C1–C4 show measured large values of maximum blur of 50 μm or more. Examples 1–4 show measured small values of maximum deficiency of 10 μm or less. While Comparative Examples C2–C4 show measure large values of 40 μm or more.

Example 6

In this example, the resistance values on the ceramic substrate of the resistor formed is measured with respect to Examples 1 and 3, and Comparative Examples C1 and C3. A resistance value is proportional to the volume of the resistor. So measurement of the spread in the resistance values is effective for obtaining the change in the volume of the resistor. The measurements are carried out by means of a conventional method. Table 2 shows the results.

As Table 2 shows, Examples 1 and 3 show a spread of resistance values of 20% or less, and Comparative Examples C1 and C3 show a spread of 30% or more. As a result, Examples 1 and 3 provide an effective process for producing a circuit substrate on which precise wiring patterns can be formed.

TABLE 1

|  | Maximum blur (μm) | Maximum deficiency (μm) |
| --- | --- | --- |
| Example 1 | 5 | 3 |
| Comparative Example C1 | 55 | 8 |
| Example 2 | 7 | 9 |
| Comparative Example C2 | 51 | 41 |
| Example 3 | 6 | 6 |
| Comparative Example C3 | 80 | 90 |
| Example 4 | 7 | 10 |
| Comparative Example C4 | 60 | 40 |

TABLE 2

|  | Spread of resistance value |
| --- | --- |
| Example 1 | ±18% |
| Comparative Example C1 | ±32% |
| Example 3 | ±20% |
| Comparative Example C3 | ±33% |

Example 7

Figure 14:
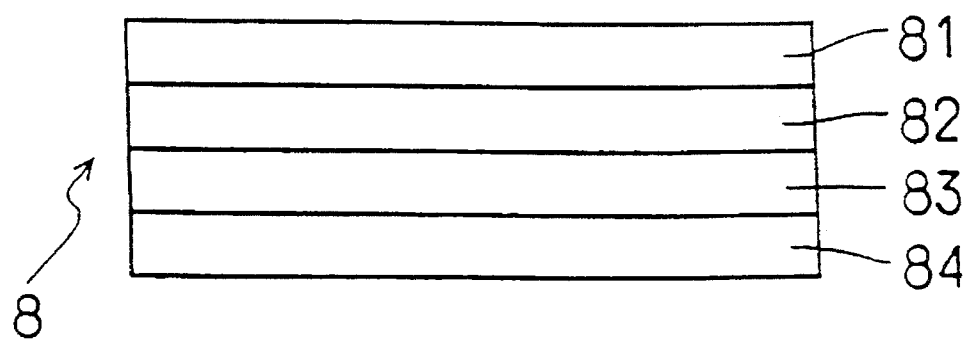
FIG. 14 is a sectional view taken on line 3—3 of FIG. 15.
Figure 15:
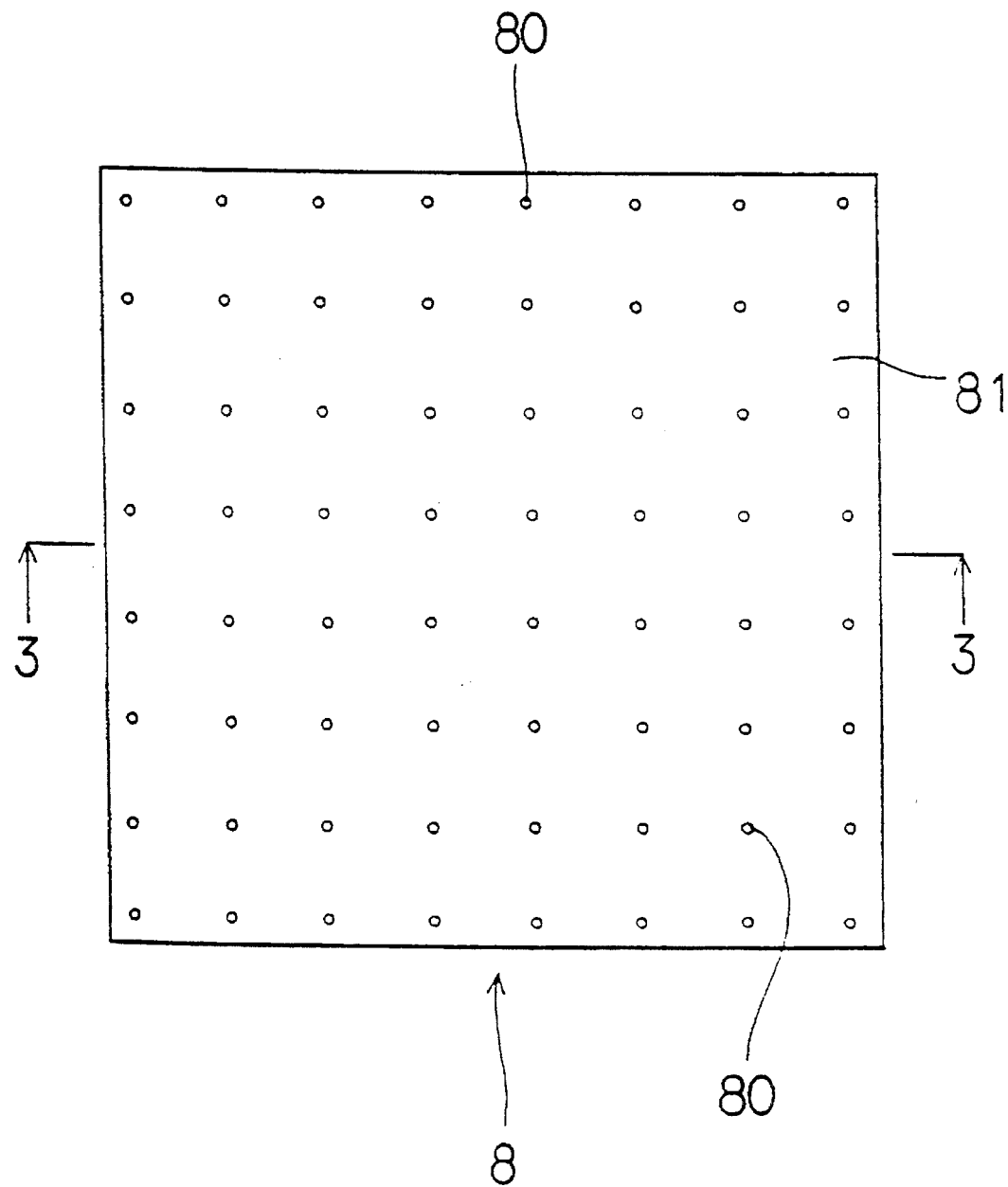
FIG. 15 is a plan view showing the via hole of a circuit substrate obtained in Example 7.

Example 7 according to the present invention will be described in reference to FIGS. 10 to 15. As FIGS. 14 and 15 show, a circuit substrate 8 is composed of ceramic substrates 81 to 84, and a plurality of holes 80 punched therein which are filled with conductive material.

The process for producing the above circuit substrate will be described referring to FIGS. 10 to 13. In the first step, ceramic greensheets, and unsinterable greensheets, which are not sintered at a sintering temperature of the ceramic greensheets, are prepared. The ceramic greensheets (thickness: 0.3 mm) are formed of a material for forming the substrate which can be fired at a low temperature. In order to form the ceramic greensheets, an organic binder, plasticizer, and solvent are added to a mixed powder of glass ($CaO$—$Al_2O_3$—$SiO_2$—$B_2O_3$: 60 wt. %) and alumina powder (40 wt. %). The mixture is kneaded to form slurry. The slurry is formed into the ceramic greensheet by doctor blade casting.

The unsinterable greensheet (thickness: 0.3 mm), formed of alumina, is unsinterable at the sintering temperature of the ceramic greensheet. It is obtained by the same procedure as that used for the ceramic greensheet. The prepared ceramic greensheets and unsinterable greensheets are cut into square pieces (150 mm×150 mm). A plurality of holes 80 are punched in the ceramic greensheets as FIG. 15 shows, and they are filled with conductors.

Figure 11:
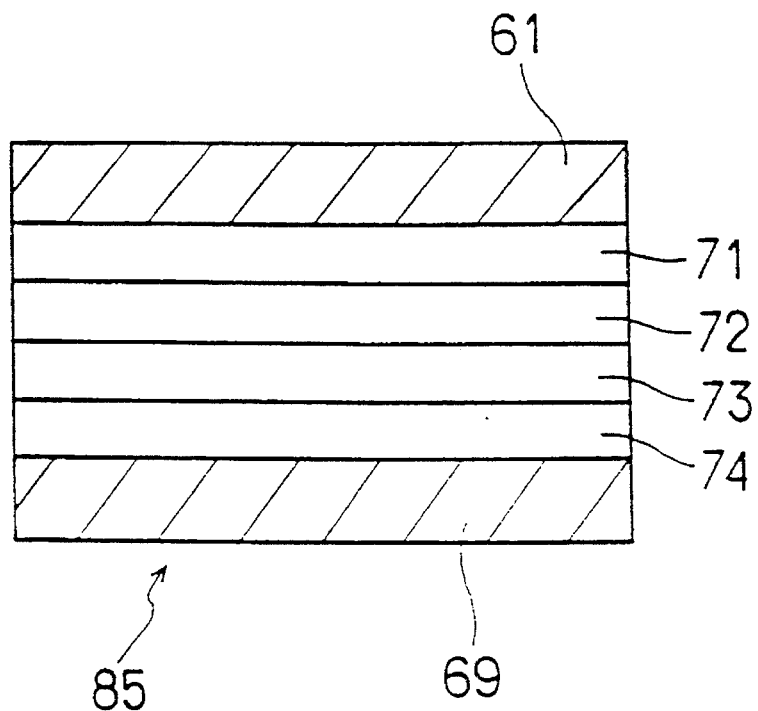
FIG. 11 is a sectional view of a laminated body obtained in Example 7.

In the second step, as FIG. 11 shows, the ceramic greensheets 74, 73, 72 and 71 are stacked sequentially from the bottom. The unsinterable greensheets 61 and 69 are placed on both surfaces of the green body of the ceramic greensheets 71–74 in order to prepare laminated body 85.

In this step, it is preferable to print wiring patterns on the surface of the unsinterable greensheets 61 and 69 by applying a conductor. By following this step, wiring patterns can be applied on the front and reverse surfaces of ceramic substrates 81–84. The conductor is selected from the group consisting of Ag, Pd—Ag, Pt—Ag, Au and Cu.

Figure 12:
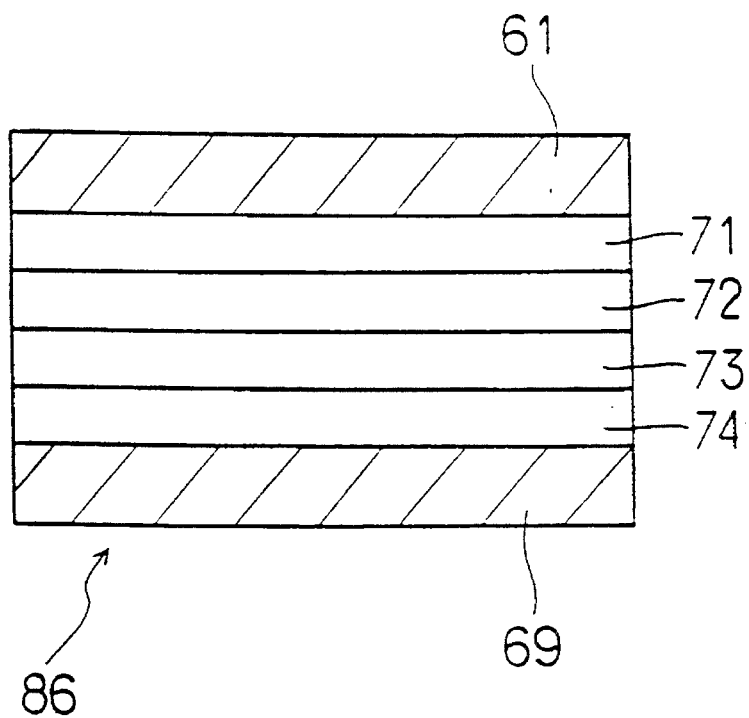
FIG. 12 is a sectional view of a compressed body obtained in Example 7.

In the third step, as FIG. 12 shows, the prepared laminated body 85 is compressed, while maintaining the planar elongation rate of 0.05% or less so as to obtain a compressed body 86.

Figure 10:
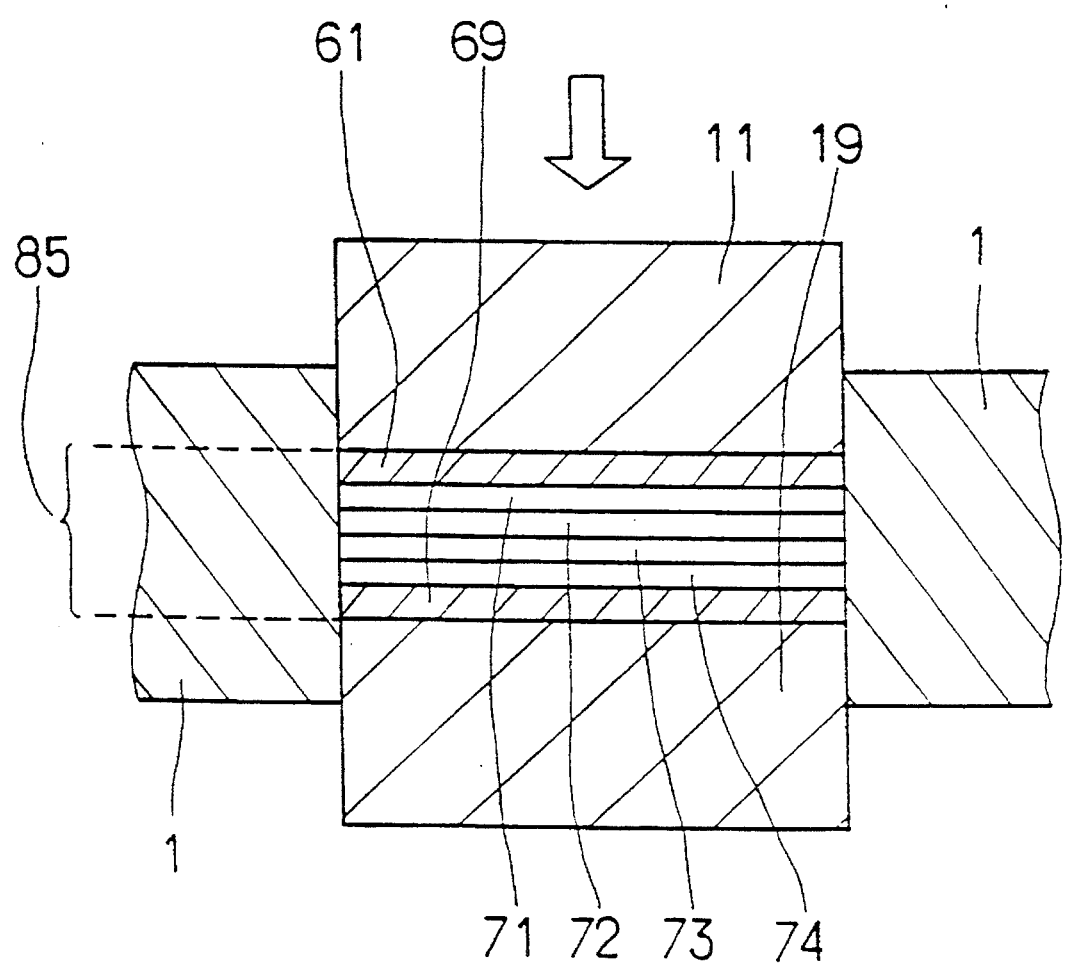
FIG. 10 represents the step for producing the compressed body of Example 7.

As FIG. 10 shows, the laminated body 85 is placed in a rigid frame 1 having the shape of the laminated body 85. Downward and upward pressures are applied to the laminated body 85 by means of the upper and lower plates 11 and 19, respectively. The rigid frame 1 having the same inner dimensions as those of the laminated body 85 is formed into a square (150 mm×150 mm). It is then compressed at 50 kg/cm² and 100° C. for 20 seconds. After compression, the plates 11 and 19 are removed and the resultant compressed body 86 is taken from the rigid frame 1.

Figure 13:
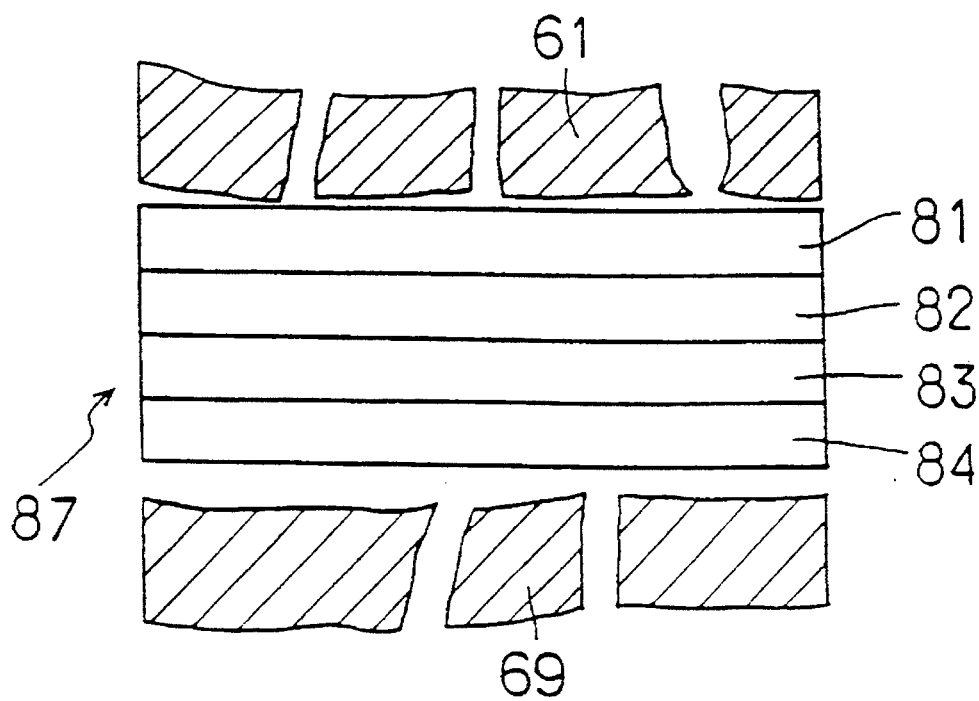
FIG. 13 is a sectional view of a sintered body obtained in Example 7.

In the fourth step, the prepared compressed body is fired at a temperature high enough to sinter the ceramic greensheets, resulting in a sintered body 87 as shown in FIG. 13. The sintered body 87 is composed of ceramic substrates 81–84 as sintered ceramic greensheets 71–74, and unsinterable greensheets 61 and 69. The compressed body 86 is fired in the air at a peak temperature of 900° C. which is maintained for 20 minutes.

Proceeding to the fifth step, the unsintered greensheets 61 and 69 are manually removed from the fired body 87. Then a small amount of alumina powder residing in the surface is completely removed in the solvent by means of ultrasonic washer. The circuit substrate 8 as shown in FIG. 14, thus, can be obtained.

In the third step of this example, the laminated body is compressed into a compressed body while maintaining the planar elongation rate of 0.05% or less. As a result, planar elongation rate and planar dimensional dispersion of the compressed body prior to firing is kept as minimal as possible. Furthermore, after heating and firing the compressed body 86, its firing planar shrinkage rate and planar dimensional variation are also kept at a minimum.

The laminated body 85, placed in the rigid frame 1 having the same shape, is subjected to downward and upward pressures by the upper and lower plates and is formed into compressed body 86. The rigid frame 1 serves to prevent the ceramic greensheets 71–74 from elongating in a planar direction when compressing the laminated body 85. As a result, the circuit substrate 8 having excellent planar dimensional precision can be obtained.

Example 8

Figure 16:
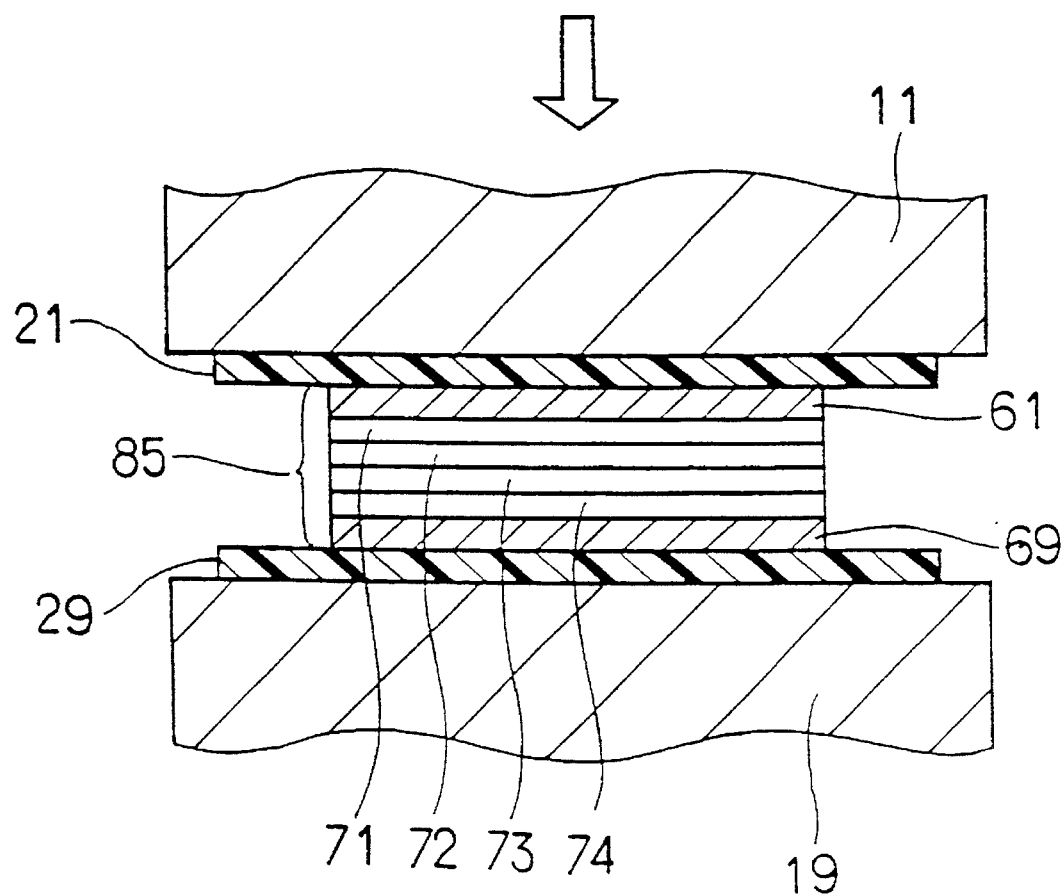
FIG. 16 represents the step of producing the compressed body of Example 8.

This example is the same as Example 7 except that the rigid frame is not used in the third step of Example 7, and films 21 and 29 (surface roughness: 0.5 μm Ra), i.e., polyester film, are inserted between the laminated body 85, and the upper and lower plates 11 and 19, respectively, as shown in FIG. 16. The laminated body 85 in the presence of the films 21 and 29 is compressed into a compressed body. Then the films 21 and 29 are removed from the compressed body. This example allows the ceramic greensheet to decrease its planar elongation rate, and the compressed body to have excellent planar dimensional precision. This example provides the same effects as those of Example 7.

Example 9

Figure 17:
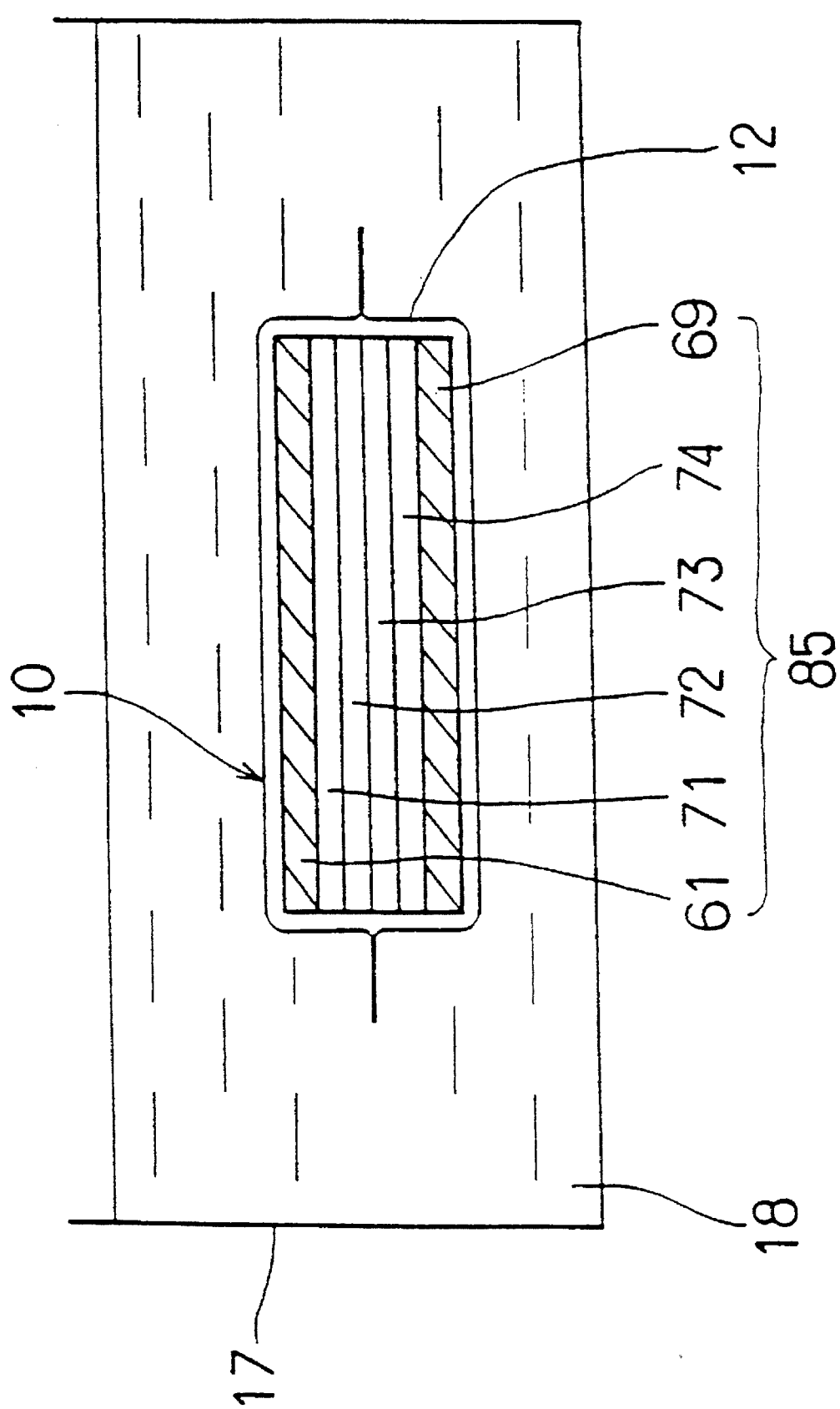
FIG. 17 represents the step of producing the compressed body of Example 9.
Figure 18:
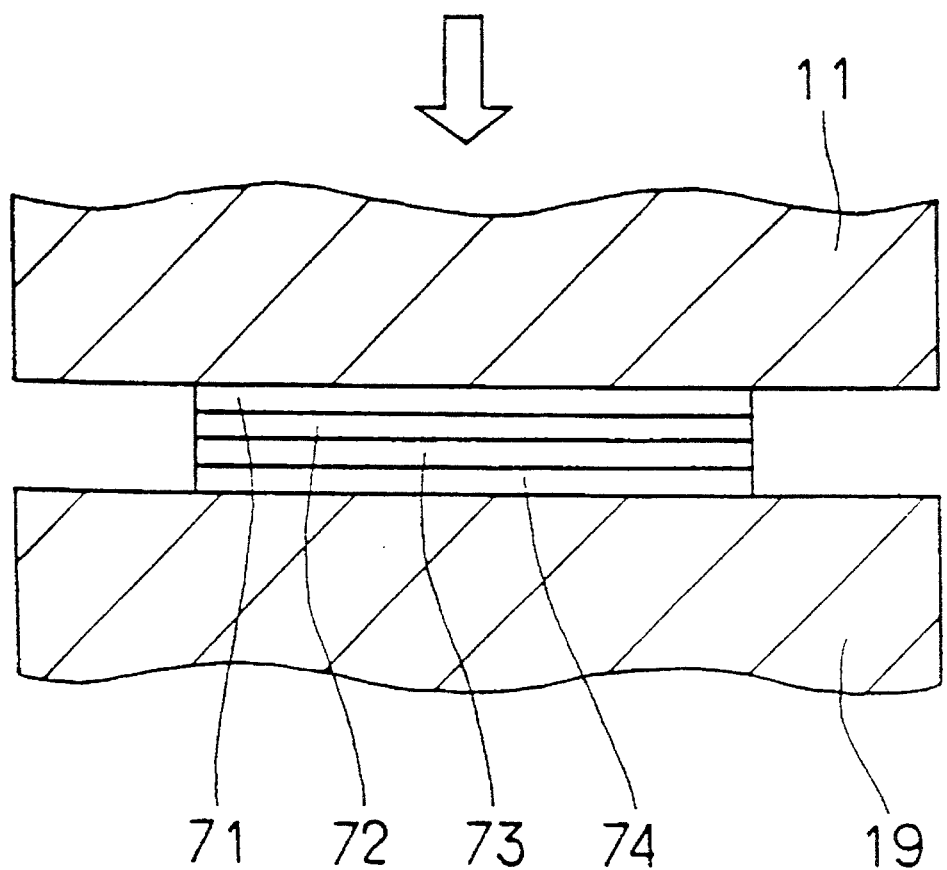
FIG. 18 represents the step of producing the circuit substrate of a conventional process.
Figure 19:
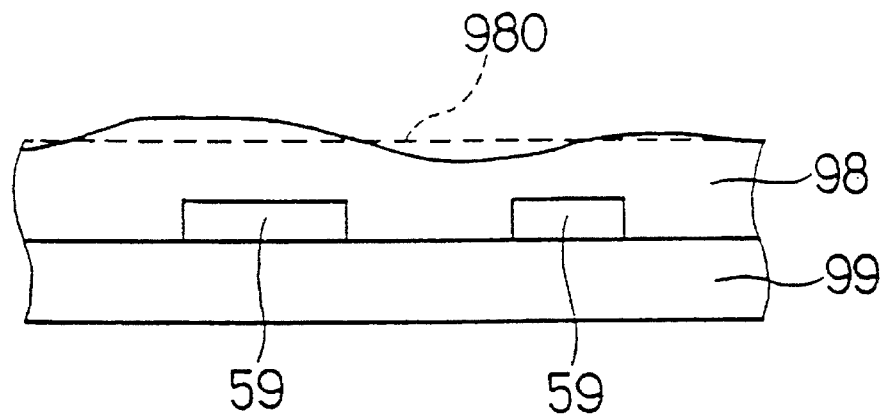
FIG. 19 represents the step of producing the circuit substrate of another conventional process.

In this example, the laminated body is compressed in a liquid by means of iso-directional pressurization in the third step as FIG. 17 shows. The laminated body 85 is placed into a water-proof bag 12. The bag 12 carrying the laminated body 85 is sealed and forms a seal 10 about the laminated body. The inside of the seal 10 is preferably under vacuum. The seal 10 is submerged into a water tank 17 filled with liquid 18, i.e., water. The liquid 18 is pressurized at 80 kg/cm² and 80° C. for 120 seconds. After pressurization, the resultant compressed body is taken from the bag 12. In this example, uniform pressure is applied to the laminated body 85 in all directions by means of the iso-directional pressurization. The resultant compressed body has the least planar elongation rate and planar dimensional dispersion. Other features and effects are the same as those of Example 7.

Example 10

In this example, the planar elongation rate of the laminated body, the planar shrinkage rate of the compressed body after firing, and the dimensional tolerance of the ceramic substrate in the respective Examples 7, 8, and 9 are measured. The measurement is carried out by measuring the dimensional coordinates of holes 80 (diameter: 0.3 mm) punched in the ceramic substrate 81 as FIG. 15 shows.

As Comparative Examples C5–C8, 4 types of circuit substrates are produced by means of the following process for the purpose of comparison. The obtained circuit substrates are subjected to the same measurements as above.

In forming the circuit substrate of Comparative Example C5, the laminated body is sandwiched between the upper and lower plates, and compressed in the third step described in Example 7 without using the rigid frame. Other steps are the same as those of Example 7.

The circuit substrate of Comparative Example C6 is formed in the same way as the circuit substrate of Comparative Example C5 except that the laminated body is composed of ceramic greensheets only and no unsinterable greensheet is used.

The circuit substrate of Comparative Example C7 is formed in the same way as Example 7 except that the laminated body is composed of ceramic greensheets only and no unsinterable greensheet is used.

The Comparative Example C8 is formed in the same way as Example 9 except that the laminated body is composed of ceramic greensheets only, and no unsinterable greensheet is used.

In the processes of Example 7, 8 and 9, planar elongation rates of 0.05% or less were obtained for the compressed bodies, and planar shrinkage ratios of the compressed bodies after firing were 0.32 or less. The planar dimensional tolerances of the ceramic substrate were ±0.05% or less. In Comparative Examples C5 and C6 the case of the upper and lower plates resulted in relatively higher extension rates compared to the other examples. Comparative Examples C6–C8 using no unsinterable greensheets resulted in substantially high planar shrinkage ratios and planar dimensional tolerances of the ceramic bodies compared with the other examples. As described above, it is obvious that the process steps in Examples 7, 8 and 9 contribute to a reduced planar elongation rate of the laminated body, a reduced planar shrinkage ratio of the compressed body after firing, and improved planar dimensional tolerance of the ceramic substrate.

While the invention has been described with reference to examples, it is to be understood that modifications or variations may be easily made by a person of ordinary skill in the art without departing from the scope of this invention which is defined by the appended claims.

TABLE 3

|  | Compression | Unsinterable green sheet | Elongation rate (%) | Shrinkage ratio (%) | Dimensional tolerance (%) |
| --- | --- | --- | --- | --- | --- |
| Example 7 | Rigid container | Used | 0.03 | 0.28 | ±0.05 |
| Example 8 | Film | Used | 0.05 | 0.27 | ±0.05 |
| Example 9 | Iso-directional pressurization | Used | 0.01 | 0.32 | ±0.04 |
| Comparative Example 5 | Upper/lower plates | Used | 0.12 | 0.23 | ±0.09 |
| Comparative Example 6 | Upper/lower plates | Not used | 0.12 | 17.1 | ±0.33 |
| Comparative Example 7 | Rigid container | Not used | 0.03 | 17.0 | ±0.31 |
| Comparative Example 8 | Iso-directional pressurization | Not used | 0.01 | 17.1 | ±0.26 |

What is claimed as new and is desired to be secured by Letters Patent of the United States is:

1. A process for producing a circuit substrate comprising the steps of:

preparing at least one ceramic greensheet containing glass and which is sinterable at a low temperature for forming said circuit substrate, and at least one unsintered transfer sheet unsinterable at a sintering temperature of said ceramic greensheet;

printing a wiring pattern on said unsintered transfer sheet;

stacking said unsintered transfer sheet on said ceramic greensheet to form a laminated body and thermocompressing said laminated body to form a compressed body;

firing said compressed body at a sintering temperature of said ceramic greensheet to form a ceramic substrate without compressing said compressed body by a compressing means, thereby preparing a fired body by transferring said wiring pattern on said unsintered transfer sheet to said ceramic substrate; and removing said unsintered transfer sheet from said fired body to prepare a circuit substrate.

2. The process as in claim 1, wherein said ceramic greensheet is pre-sintered prior to stacking said unsintered transfer sheet thereon.

3. The process as in claim 1, wherein said ceramic greensheet is provided with holes filled with a conductor prior to the process for stacking said ceramic greensheet and said unsintered transfer sheet.

4. The process as in claim 1, wherein said ceramic greensheet is provided with a wiring pattern, or a resistor on at least one of its surfaces prior to stacking said unsintered transfer sheet thereon.

5. The process as in claim 1, wherein said ceramic greensheet is provided with holes filled with a conductor and with wiring patterns, or a resistor on at least one of its surfaces.

6. The process as in claim 1, wherein said laminated body is placed in a rigid frame having the shape of the laminated body and then upward and downward pressures are applied by means of upper and lower parallel plates which sandwich said laminated body thereby forming a compressed body; and taking out said compressed body from said rigid frame and from said upper and lower parallel plates.

7. The process as in claim 1, wherein said laminated body is compressed in a liquid by means of iso-directional pressurization.

8. The process as in claim 1, wherein said laminated body is compressed in the presence of films, having a surface roughness of 0.4–0.75 μm Ra, between said unsintered transfer sheet and upper and lower parallel plates sandwiching said laminated body to form a compressed body; and then said film and upper and lower plates are removed from the compressed body.

9. The process as in claim 1 or 2, wherein said unsintered transfer sheet is stacked at least on one outermost surface of said ceramic greensheet.

10. The process as in claim 1, wherein said laminated body is stacked in plurality to form a plural layer, and then being thermocompressed.

11. The process as in claim 1, wherein said ceramic greensheets used for forming a ceramic substrate, are sinterable at a low temperature ranging from 800° to 1000° C.

12. The process as in claim 1, wherein said unsintered transfer sheet is formed of a material selected from the group consisting of alumina, zirconia, and mullite.

13. A process for producing a circuit substrate comprising the steps of:

preparing a sintered ceramic substrate;

applying an intermediate layer containing glass and sinterable at a low temperature for forming said circuit substrate on said sintered ceramic substrate;

printing a wiring pattern, or a resistor on the unsintered transfer sheet unsinterable at a sintering temperature of said intermediate layer;

stacking said unsintered transfer sheet on said intermediate layer over said sintered ceramic substrate to form a laminated body and thermocompressing said laminated body to form a compressed body;

firing said compressed body at a sintering temperature of said intermediate layer to form one body of said intermediate layer and said sintered ceramic substrate, thereby preparing a fired body by transferring said wiring pattern on said unsintered transfer sheet to said intermediate layer; and removing said unsintered transfer sheet from said fired body thereby preparing a circuit substrate.

14. The process as in claim 13, wherein said ceramic substrate is made of a material selected from the group consisting of alumina, zirconia, mullite, and aluminum nitride.

15. The process as in claim 13, wherein said intermediate layer is in the form of paste before it is applied, which is composed of glass and/or glass ceramic, and a binder.

16. The process as in claim 13, wherein said intermediate layer is a sheet.

17. The process as in claim 13, wherein said intermediate layer is sinterable at a low temperature of 1000° C. or less.

18. The process as in claim 13, wherein said unsintered transfer sheet is stacked at least on one outer surface of said intermediate layer.

19. A process for producing a circuit substrate comprising the steps of:

preparing at least one ceramic greensheet having a via hole filled with a conductor, a wiring pattern or a combination thereof, and an unsinterable transfer greensheet which is not sintered at a sintering temperature of the ceramic greensheet;

printing a wiring pattern on said unsintered transfer greensheets;

stacking said unsinterable transfer greensheets on both surfaces of said ceramic greensheet, which stack is to be formed into a laminated body;

placing said laminated body in a rigid frame having the shape of the laminated body and providing films of an organic substance selected from the group consisting of polyester, polyphenylene sulfide, polyether imide, polyether sulfone, polyether ketone, polyimide, methylpentene copolymer and paper having a surface roughness of 0.4–0.75 μm Ra, between the laminated body and each of the upper and lower parallel plates of the rigid frame;

applying upward and downward pressure by said upper and lower parallel plates which sandwich said laminated body, thereby preparing a compressed body while maintaining its planar elongation rate under 0.05%;

taking out said compressed body from said rigid frame;

firing said compressed body at a sintering temperature of said ceramic greensheet without compressing said compressed body by a compressing mean; and removing said unsinterable transfer greensheet from said compressed body, thereby preparing a circuit substrate.

20. The process as in claim 19, wherein said ceramic greensheet is formed of a material for forming a substrate sinterable at a low temperature of 1000° C. or less.

21. The process as in claim 19, wherein said unsinterable transfer greensheet is formed of an alumina material.

22. A process for producing a circuit substrate comprising the steps of:

preparing at least one ceramic greensheet and at least two unsinterable transfer greensheets which are not sintered at a sintering temperature of the ceramic greensheet;

printing wiring patterns on said at least two unsinterable transfer greensheets;

stacking said unsinterable transfer greensheets on both surfaces of said ceramic greensheet, which stack is to be formed into a laminated body;

compressing said laminated body in a liquid by isodirectional pressurization thereby preparing a compressed body while maintaining its planar elongation rate under 0.05%;

removing said compressed body from said rigid frame;

firing said compressed body at a sintering temperature of said ceramic greensheet without compressing said compressed body in a compressing means, thereby preparing a fired body by transferring said wiring patterns on said at least two unsinterable transfer greensheets to said ceramic substrate; and removing said unsinterable transfer greensheets from said compressed body thereby preparing a sintered ceramic substrate.

23. The process as in claim 22, wherein said laminated body is placed in a water-proof bag and sealed, and said sealed body is submerged in liquid where it is subjected to iso-directional pressurization.

24. The process as in claim 23, wherein said sealed bag containing said laminated body is under a vacuum.

* * * * *